United States Patent [19]

Hojaji

[11] Patent Number: 5,306,700
[45] Date of Patent: Apr. 26, 1994

[54] DENSE MELT-BASED CERAMIC SUPERCONDUCTORS

[75] Inventor: Hamid Hojaji, Bethesda, Md.

[73] Assignee: The Catholic University of America, Washington, D.C.

[21] Appl. No.: 938,612

[22] Filed: Sep. 1, 1992

[51] Int. Cl.$^5$ .................... C01F 11/02; C01G 3/02; H01B 1/08; H01L 39/24

[52] U.S. Cl. .................... 505/450; 264/60; 264/66; 505/725; 505/733; 505/742; 505/785; 505/490; 505/492

[58] Field of Search .............. 505/1, 785, 742, 733; 264/60, 66

[56] References Cited

U.S. PATENT DOCUMENTS

| | | | |
|---|---|---|---|
| 4,956,336 | 9/1990 | Salama | 505/742 |
| 4,983,571 | 1/1991 | Rao | 505/1 |
| 5,026,680 | 6/1991 | Sugihara | 505/1 |
| 5,114,909 | 5/1992 | Shi | 505/1 |
| 5,200,392 | 4/1993 | Rao | 505/1 |

OTHER PUBLICATIONS

H. Hojaji et al., "Melt-Processed YBCO Superconductors: Processing and Properties", High Temperature Superconductors, Mater. Res. Forum, Trans Tech Publication, Switz., 1992.

H. Hojaji et al., "Superconducting Cuprates Prepared by the Melt Quench Process and Containing Excess Y or Additives", Mat. Res. Bull., 25, 765-77, 1990.

S. Hu et al.; "Bulk YBA$_2$Cu$_3$O$_x$ superconductors through pressurized partial melt growth processing"; J. Mater. Res., 7, 1-5, Apr. 1992.

A. Goyal et al.; "Fabrication of highly aligned YBa$_2$Cu$_3$O$_7$ δ–Ag melt-textured composites"; Physica C 182, 203-18 (1991).

C. K. Chiang et al.; "Levitation of Superconducting Composites"; Amsahts, 90, 181-85, NASA Publication 3100, Apri. 1, 1990.

Y. Nakagawa et al. "Superconducting Properties of Grain-Oriented Samples of Y$_1$Ba$_2$Cu$_3$O$_y$"; vol. 28, No. 4, Apr., 1989, pp. L-547-L-550.

M. Murakami et al.; "Melt Processing of Bulk High Tc Superconductors and Their Application", IEEE Transactions on Magnetis, vol. 27, No. 2, Mar. 1991, pp. 1479-1486.

P. McGinn et al.; "Microstructure and critical current density of zone melt textured YBa$_2$Cu$_3$O$_{6+x}$/Y$_2$BaCuO$_5$ with BaSnO$_3$ additions"; Appl. Phys. Lett. 59(1), 1 Jul. 1991.

J. Bock et al.; "Melt Processing of Bi-HT Superconductors: The Significance of Oxygen for Formation and Properties", ICMC '90 Topical Conference High-Temperature Superconductor. Materials Respects; May 9–11, 1990.

M. Morita et al.; "Magnets Made of QMG Crystals", preprint, 1991.

*Primary Examiner*—Paul Lieberman
*Assistant Examiner*—John Boyd
*Attorney, Agent, or Firm*—Cushman, Darby & Cushman

[57] ABSTRACT

A method is disclosed for fabricating bulk superconducting materials into shaped articles, including ones of relatively large sizes and complex shapes, which have high densities, high integrity, high magnetization and critical current densities. A mixture of superconducting material is completely or substantially melted and the molten material is then cooled to room temperature and ground to a powder. The ground powder is next mixed with a second phase made up of either precursor superconducting powder or a mixture of metallic silver and copper. The resulting mixture is then shaped into an article by conventional ceramic article forming techniques: pressing, extruding, molding or the like. The resulting shaped article is heated to a temperature at which a substantial amount of its content of second phase material is melted, thus facilitating densification of the entire shaped article. The resulting dense specimen is annealed in an appropriate environment while it is being cooled to room temperature.

43 Claims, No Drawings

DENSE MELT-BASED CERAMIC SUPERCONDUCTORS

FIELD OF INVENTION

This invention relates to a novel method of producing bulk superconducting materials and items made from such materials.

BACKGROUND OF THE INVENTION

High temperature superconducting materials based on either Y—Ba—Cu—O (YBCO) or Bi—Sr—Ca—Cu—O (BSCCO) are known to have high transition temperatures of about 90° K and about 115° K, respectively. Both of these systems have been successfully used to produce high quality thin films. In the YBCO system, large current densities exceeding 1 million amperes per square centimeter at 77° K have been reported by many groups.

The formation of large bulk specimens (including wires) having very high current densities and high magnetizations has not been as successful as has the preparation of thin films, for reasons which have been associated with intergranular weak links and macro-defects, such as the presence of voids or other second phases, present in such larger bulk specimens. The advent of melt processing techniques in recent years, however, has allowed smaller bulk specimens to be produced, some of which are almost free from weak links, exhibit very high magnetization (about 5000 Gauss at 77° K) and current densities up to about $5 \times 0^4$ A/cm². Unfortunately, these small articles have little practical application, and cannot be used, for example, in magnetic levitation, electric power transmission, as permanent magnets, or in magnetic energy storage, where much larger (or in the case of wires, longer) specimens are required.

Melt processed high temperature bulk superconductors have proven to be superior to sintered materials with respect to critical current density and magnetization. The melt processing techniques which have produced the best quality bulk specimens to date are those where the superconducting powder precursors (either calcined or non-calcined) are first melted and then cooled rapidly.

At this stage, however, the phases which are present are not superconducting. Thus, it is necessary to next go through several peritectic reactions in order to re-convert the majority of the material to a superconducting phase or phases. The conversion is accomplished by reheating the rapidly cooled (quenched) superconducting powder precursor to a temperature above the lowest peritectic temperature, typically above about 1080° C., and then slowly cooling the mass to room temperature (about 25° C.). During the phase decomposition associated with the peritectic reaction achieved by reheating the quenched material above the lowest peritectic temperature, the liquid phases which are formed are either drained from the specimen under gravitational force or are drawn to the exterior surfaces of the mass by interfacial surface energy. Under normal processing conditions both processes often take place simultaneously. A lack of sufficient liquid phase, and the rigidity of the material, which prevents changes in the volume of the solid phases, can lead to the presence of voids and insulating defects in the finished bulk specimens. See, for example, H. Hojaji, et al., "Melt-Processed YBCO Superconductors: Processing and Properties", High Temperature Superconductors, Ed. J. J. Pouch, et al., Mater. Res. Forum, Trans Tech Publications, Switz., 1992; H. Hojaji, et al., "Superconducting Cuprates Prepared by the Melt Quench Process and Containing Excess Y or Additives", Mat. Res. Bull., 25, 765-77, 1990; S. Hu, et al., "Bulk YBa$_2$Cu$_3$O$_x$ Superconductors Through Pressurized Partial Melt Growth Processing", J. Mater. Res., 7, 1-5, April, 1992.

In an attempt to produce better materials, zone melting and gradient melting have been used to produce texturing in a more controlled manner. See A. Goyal, et al., "Fabrication of Highly Aligned YBa$_2$Cu$_3$O$_7$—δ-A.G MELT-Textured Composites", Physica C, 182, 203-18 (1991). However, such techniques have not been totally successful in overcoming these defects in large superconducting specimens. Other innovative methods have been tried, such as mixing superconducting powders with a polymer matrix in order to form a composite material. See C. K. Chiang, et al., "Levitation of Superconducting Composites", Amsahts, 90, 181-85, NASA Publication 3100, Apr. 1, 1990. Although these methods are capable of producing large and complex shapes, they lack the ability to eliminate the inter-granular weak links discussed above.

Another method of fabricating improved bulk materials is a method in which the grains of a granular superconductor are first aligned in a magnetic field below the transition temperature (i.e., below 90° K in the case of YBCO). See Y. Nakagawa, et al., J.J. of Appl. Phys. 28, L547-50, April 1989. The magnetic field aligns the grains along the Cu-0 planes, as they normally carry more current than the perpendicular direction. The alignment is frozen in, and then the body is sintered to preserve the alignment Although this method is superior to regular solid state sintering, it does not eliminate the weak links in the structure.

It should be noted that in order to obtain high-quality superconducting specimens, insulating line defects, such as cracks and insulating grain boundaries, should be eliminated. However, localized phase impurities can be very useful by acting as flux pinning centers. Several methods have been proposed to obtain high quality melt based materials.

One such method is disclosed in Hojaji, et al. U.S. patent application Ser. No. 07/659,719, the contents of which are incorporated by reference herein. This method includes the introduction of an impurity phase to improve flux pinning and has proved to be beneficial in increasing the pinning forces, even at very high applied fields.

Another prior art melt processing method which uses secondary processing, i.e., a second thermal treatment of the melted and quenched material. This addresses a problem found in single stage processes: leakage of the liquid phase at elevated temperatures in such processes is detrimental to the formation of macro-defectfree large bulk superconductors.

A third prior art melt processing method involves mixing silver with ground melt processed material. This method, however, also suffers from certain drawbacks. For example, the presence of non-superconducting silver at the grain boundaries can hinder the supercurrent from circulating across the whole material. As a result, complete shielding of the magnetic flux cannot be obtained. This means, in turn, that partial penetration of the magnetic flux into non-superconducting regions of the bulk superconductor produces a lower levitation force and a correspondingly low current density compared to impurity free superconductors. See A. Goyal, et al., *Physica C,* 182. 1991.

Accordingly, it is an object of this invention to provide a method of processing bulk superconducting materials that produces highly dense bulk specimens with excellent magnetic and transport properties. It is believed, without limiting the scope of this invention, that the effectiveness of this inventive method is due to its success in eliminating the aforementioned defects and weak links which reduce current-carrying capability, while it permits the presence of flux pinning centers.

This method can be used to produce very large specimens with complex shapes that also have excellent mechanical integrity.

SUMMARY OF THE INVENTION

One embodiment of this invention is an improved method of producing bulk articles made of high temperature superconductors which exhibit superior magnetic and electronic properties. This method comprises the steps of:

(a) mixing appropriate amounts of YBCO or BSCCO oxide precursors;

(b) optionally calcining the mixture at least once in order to cause the ingredients to react together;

(c) melting the resulting mixture; preferably in a crucible made wholly or partially of a metal of the platinum group i e , Group VIII A, second and third rows of the Periodic Table, made up of ruthenium, rhodium, palladium, osmium, iridium and platinum, preferably platinum, or an alloy containing one or more of such refractory metals, or the like, so that platinum or the like will be added to the YBCO or BSCCO oxide mixture in an amount ranging from about 0.05 percent to about 10 percent by weight, based on the total weight of the mixture; if desired such amounts of platinum or the like can be added directly to the YBCO or BSCCO oxide mixture;

(d) quenching the molten material by rapid cooling;

(e) optionally re-heating and cooling the melt-quenched material in order to anneal it;

(f) grinding the melt quenched or annealed materials to form a powder;

(g) mixing the ground material with a second phase comprising a compatible powder, such as calcined or non-calcined starting material, or another melt quenched powder prepared by direct melting, e.g., by containerless melting;

(h) forming the mixed powder into a shaped article, either by pressing alone or pressing in the presence of a binder, preferably an organic binder; and (i) firing the shaped article and annealing it to promote grain growth.

An additional embodiment of this invention is a process for forming a superconducting article, where the second phase is a mixture of metallic silver and copper.

A further embodiment of the present invention is a process for forming a superconducting article, wherein the second phase is a mixture of (1) a mixture of metallic silver and copper; and (2) a compatible powder.

A still further embodiment of this invention is a process for forming superconductive articles whose second phase is a binding phase which may be one or more organic polymers or metallic elements (silver, copper, or the like).

DETAILED DESCRIPTION OF THE INVENTION

This invention provides a method for fabricating dense bulk superconductors, including large bulk materials, which have various sizes and shapes. This method, unlike solid state sintering and other related methods, is capable of producing dense materials which have very high magnetization and critical current density.

The present invention is based on the discovery that mixing a melt-processed powder precursor, such as a melt-quenched powderprecursor, with a second phase comprising at least a partially compatible superconducting powder, such as calcined or non-calcined starting material, produces materials which are highly densified, and when the second phase is a compatible powder are all completely superconducting throughout their entire volume at temperatures below the transition temperature. The second phase can be doped, if desired, with appropriate dopants such as salts or oxides of platinum, praseodymium, tin or an alkali metal, or the like, in amounts ranging up to about 10 percent by weight, based upon the total weight of the mixture. Other additives such as melt quenched powders produced by rapid heating and cooling, such as ones melted by a hydrogen torch, or yttrium rich phase powders, such as $Y_2O_3$, $Y_2BaCuO_5$, or the like, can also be added in amounts ranging up to about 80 percent by weight, based upon the total weight of the mixture. Such dopants and other additives will be added prior to or while the melt processed powders are being mixed. The resulting mixture is formed into an appropriate shape, e.g., a disk, a cylinder or a rod, and this shaped body is then fired to a temperature sufficient to at least melt a portion, preferably from about 10 percent to about 100 percent, of the second phase, e.g. above about 1000° C. in the case of the YBCO system and above about 900° C. in the case of the BSCCO system.

Firing produces a liquid phase, which may be a combination of several liquid phases, formed within the granular particles which aids in densification of the body. This method is superior to the method described in M. Murakami, et al., "Melt Processing of Bulk High Tc Superconductors and their Application", *IEEE Transactions on Magnetics,* 27, 1479-86, March, 1991, where only powders of melt-quenched materials are mixed without the addition of a compatible second phase.

Additionally, mixtures of metallic copper and silver can be used as a second phase to densify melt processed powder either alone or in conjunction with the superconducting powders mentioned above. The presence of copper aids the dissolution and precipitation at the granular interface. This in turn facilitates the liquid phase sintering process. For example, mixtures of metallic copper and silver can be used which contains at least about 1 wt % silver, and preferably from about 10 wt % to about 90wt % silver, and particularly a mixture which is near the eutectic composition of 71.9 wt % silver. The eutectic temperature is at 779.4° C. Such a low melting temperature alloy, when mixed with the melt processed powders, can improve the densification of the resulting bulk specimens.

The process of the present invention forms bulk supercondutors of the YBCO and BSCCO systems by mixing a powdered portion of a previously melt processed material containing one or several metals from the platinum group, hereinafter called the first phase, with a second phase comprising at least a portion of compatible powder precursors in either melted, calcined or non-calcined form, or metallic alloys of silver and copper, or flux pinning dopants and other additives (e.g. $BaSnO_3$) which can aid solidification and enhance pinning. See, e.g., P. McGinn, et al., Appl. Phys. Lett. 59 (1), July, 1991.

The second phase may be in whole or in part a mixture of metallic copper and metallic silver. The amount of silver present is 1 to 99% by weight, relative to the combined weight of the silver and copper, with the copper being correspondingly present in an amount 99 to 1% by weight. Preferably, the silver is present in about 70% by weight.

Another embodiment of the present invention, one not requiring additional high temperature treatment of the mixture of the first and second phases, involves adding a binder to the second phase to bond the melt processed particles together. The binder will preferably be organic, e.g., an adhesive or glue such as mucilage, rubber cement (a solution of natural or synthetic rubber in a suitable organic solvent, with or without a curing agent), a casein-base, polyvinyl acetate, epoxy or phenolformaldehyde adhesive, or the like, and the mixture of the first and second phases with the binder will simply be mechanically pressed, e.g., in the form of a disk, tape cast, screen printed, etc., to bond the melt processed particles together.

The first phase is prepared by mixing an appropriate amount of oxide precursors. In the case of the YBCO system these include at least a portion of oxides of Y, Ba, and Cu; preferably the ratio Y:Ba:Cu will be about 1:2:3 but other ratios of Y:Ba:Cu, in which Y can be from about 1 to about 2, Ba can be from about 1 to about 3, and Cu can be from about 1 to about 4, are also suitable. This mixture may also include other additives to improve the flux pinning characteristics of the resulting superconductor, as disclosed for instance in Hojaji, et al. U.S. patent application No. 07/659,719. And other fluxing agents, such as alkali metal oxides, boron oxide, or the like, can also be added to facilitate melting and texturing. In the case of the BSCCO system, oxides of Bi, Sr, Ca, and Cu are mixed together to give a ratio of Bi:Sr:Ca:Cu preferably of from about 2:2:1:2 to about 2:2:2:3, but other ratios of Bi:Sr:Ca:Cu, in which Bi, Sr and Ca can each be from about 1 to about 2 and Cu can be from about 1 to about 4, are also suitable. In addition, other oxide additives such as oxides of Pb or of alkali metals may be introduced in minor quantities. For example, Pb can replace up to about half of the moles of Bi in the formulation.

Any oxide of Y, Ba or Cu which will form a superconducting product is suitable for use in the claimed process. Preferred oxides include, but are not limited to, $Y_2O_3$, BaO and CuO. The oxides may be mixed in any ratio which provides a superconducting product. The ratios exemplified hereinabove are intended as illustrations, those skilled in the art will be able to determine other appropriate ratios.

For the BSCCO system, any oxide of Bi, Sr, Ca and Cu which will form a superconducting product is suitable for use as a starting material. Examples of suitable oxides include bismuth nitrate pentahydrate, calcium oxide, strontium carbonate and copper oxide. The oxide precursors may be mixed in any ratio which provides a superconducting product. See, J. Bock, et al., *ICMC '90 Topical Conference*, "High Temperature Superconductors. Materials Aspects", May, 1990. Regardless of the system and of the exact composition, the mixtures are preferably calcined in order to react the ingredients together. To improve homogeneity, calcination may be repeated several times. Calcination temperatures and times may vary, depending on the identities and concentrations of the precursors present.

For YBCO systems, the calcination temperature can vary from about 900° C. to about 1000° C., preferably from about 920° C. to 960.C. The calcination time can vary from several hours to several days, preferably from 10 to 24 hours. Calcination can be performed either in air or in oxygen. Preferably, calcination is conducted under flowing oxygen at atmospheric pressure. For BSCCO systems, the calcination temperatures are somewhat lower than for YBCO systems. The calcination temperatures for BSCCO systems are in the range from about 800° C. to 950° C., preferably from about 820° C. to 900° C. Calcination times and atmospheres are similar to those used for YBCO systems. However, in BSCCO systems, air is preferred over pure oxygen, since BSCCO is less sensitive to oxygen partial pressure than YBCO.

After calcination, the resulting powders are melted in an appropriate crucible at an elevated temperature. Among the materials suitable for use as the crucible are a metal from the platinum group and alloys thereof, which have been successfully used to melt both systems. When a crucible made of platinum or the like is used, a small portion of the crucible is dissolved in the molten material being melted. Melting occurs to a greater extent in the case of YBCO systems than in BSCCO systems, because of the former's higher melt temperature and possibly higher solubility. Platinum may play a beneficial role in flux pinning; see Morita, et al., "Magnets Made of QMGCrystals", preprint, 1991, and also allows the composite bodies to be heat treated to higher temperatures, e.g., to about 1200° C., without collapsing. It has been found that platinum group metal-containing materials can withstand higher temperatures in both the second heat treatment and the final firing step than can the corresponding materials without platinum or the like, without appreciable deformation after reheating. Thus, to preserve the composite product's shape after final firing it is important that at least a portion of the first phase be a platinum group metal-containing powder.

Other melting techniques, such as crucible-less melting by RF, plasmas, lasers, open flames, e.g., an open hydrogen flame, or the like, can also be used to melt these materials. It has been found that a hydrogen gas flame is particularly useful in melting preforms made of YBCO materials. However, since such powders do not contain platinum unless initially doped with platinum, they cannot withstand high temperatures in the final firing process without substantial deformation. Melt quenched materials which do not contain platinum can be all or a part of the second phase.

Mixed non-calcined powder precursors can also be subjected to melting. Non-calcined mixtures may take a slightly longer time to form a homogenous melt. If the melting of YBCO materials is carried out in a container, it should be carried out at a temperature between about 1200° C. and about 1500° C., preferably at about 1300° C. to 1500° C., and most preferably at about 1400° C. to 1500° C. If the melting is done by means such as plasma, hydrogen flame or R-F melting, the temperature can be as high as 2000° C. The melting time depends on the quantity of the material being melted. This time is generally between about 10 and about 60 minutes when the material is melted in a container. When other melting means are used, e.g., a hydrogen flame, the section of the material in direct contact with the flame melts faster than the rest of the material, e.g., in from a few seconds to less than a minute, depending on its size.

The melting temperature of BSCCO is lower than that of YBCO. Melting of BSCCO materials is usually carried out between about 1100° C. and about 1350° C. Preferably, these materials are melted between about 1150° C. and about 1250° C. The melting time is similar to that of YBCO.

Regardless of the oxide system, the melt which is formed is quenched to lower temperatures, e.g., to at least about 900° C. or below. Preferably, the melts are cooled to room temperature, using one of several possible methods. Suitable quenching methods include cooling the melt in the crucible, pouring the melt out at a high temperature into a mold, using other quenching equipment such as roller mills, or immersion in non-aqueous liquids, e.g., liquid nitrogen or the like, which do not react with the material and do not pose any explosive risk. When direct heating is used, e.g., heating by hydrogen torch or RF heating, droplets of molten material are rapidly quenched by collecting them on a cooler surface, e.g., a metallic surface such as one formed by a copper or brass sheet or plate.

The quenched material is preferably used directly without any further processing. However, the quenched material may be optionally subjected to a second heat treatment to further convert nonsuperconducting phases to superconducting phases. This treatment involves reheating the melt quenched material and then annealing the reheated material by cooling it according to the schedule disclosed herein for the final firing step. The YBCO systems are preferably reheated to temperatures in the range from about 1000° C. to 1300° C. The BSCCO systems are reheated to temperatures in the range from about 800° C. to 1100° C., preferably in the range from about 900° C. to 1050° C.

The major events which take place during the reheating process are a series of phase transformations from nonsuperconducting phases. See H. Hojaji, et al., op.cit. These transformations end with the final nucleation and crystallization of the superconducting phases throughout the material. The mechanisms and kinetics of these reactions are disclosed in Hojaji, et al. U.S. patent application No. 07/659,719.

For example, without limiting the scope of the invention, in the YBCO system, the following phase transformations are believed to take place. After quenching the YBCO system from above the melting temperature, a crystalline phase of $Y_2O_3$ is uniformly dispersed in a liquid phase, which is composed mainly of Cu and Ba oxides. The amount and size of $Y_2O_3$ particles depends on melting temperature and time. Without wishing to be bound by any theory or mechanism advanced to explain the operation of this invention, applicant believes that heating above about 1600° C. results in the formation of a completely molten YBCO phase having no $Y_2O_3$ solid phase. Conventional quenching methods may, however, nucleate $Y_2O_3$ solid phase during the quenching process. After reheating to above 1100° C., the $Y_2O_3$ crystalline phase reacts with the liquid phase to form a $Y_2BaCuO_5$ (211) crystalline phase and a second liquid phase. After complete conversion of the $Y_2O_3$ phase to the 211 phase, the temperature is dropped to below about 1100° C., where a second phase transformation takes place. At this stage the 211 phase undergoes a reaction with the liquid phase, and forms the $YBa_2Cu_3O_x$ (123) phase. Further cooling to still lower temperatures causes a phase transformation of the tetragonal form of the 123 phase to the superconducting orthorhombic phase. Slow cooling to room temperature under oxygen atmosphere ensures the adequate oxygenation which is required for optimum phase purity. The use of this method greatly reduces the number of insulating weak links between the grains. This allows large magnetization values and high current densities to be obtained.

In BSCCO systems, complex phase transformations occur during the annealing process at temperatures above 800° C. Overall, however, the technique described above for the YBCO systems can produce high-quality materials based on a BSCCO system as well.

The next step is to grind the first phase, which comprises either the heat treated powders (i.e. annealed powders), or melt-quenched powders, which have not been heat treated. Preferably, the melt-quenched material is used directly without subsequent heat treatment. The first phase is ground in an appropriate grinder. Any suitable grinder can be used for this purpose, such as a porcelain mortar and pestle. Care should be taken to avoid contamination of the material during the grinding operation. For instance, contamination with aluminum oxide from an aluminum mortar and pestle is undesirable, and lowers the quality of the final product.

The average particle size of the ground material can vary from several millimeters to several microns. The particle size distribution is not critical, and can vary widely, and thus the scope of this invention is not limited to any particular particle size distribution. The selection of an appropriate particle size distribution is within the skill of the art, and is influenced by the forming technique which will be used to shape the composite articles. For instance, a wide particle size distribution is advantageous for forming articles using pressing techniques, since a suitable particle size gradient makes it possible to have a higher packing factor or higher densification. For extrusion forming techniques, a narrower size distribution may be advantageous.

After grinding, the second phase material, at least part of which has not been subjected to melting in a platinum group metalcontaining crucible or which does not contain a platinum group metal or a platinum group metalcontaining substance as a chemical additive, is added to the ground first phase material, and the first phase and second phase materials are thoroughly mixed. At least a part of the second phase is selected from calcined and non-calcined powders of superconducting oxide precursors, compatible melt processed materials which do not contain a platinum group metal, such as those melted using a hydrogen flame or RF heating, mixtures of metallic silver and copper, and the like. Methods of conducting the mixing step include, but are not limited to, ball milling, shear mixing, and ultrasonic mixing. Preferably, the second phase consists of precursors for the material which makes up the first phase.

It is also possible to mix in the second phase with the first phase during the grinding of the first phase. For example, after grinding the first phase, the second phase can be added to a mortar, and light grinding with a pestle may follow until a homogenous mix is obtained.

The amount of the second phase in the mixture can be varied widely. The melt-processed powders of the first phase may only be required as nucleating sites or as a skeletal backbone during the melting and densification of the calcined or non-calcined superconducting powder precursors or the remelting of the melted materials in the second phase. In this case, only a small percentage of the first phase need be present. For practical purposes, however, the weight percentage of the second phase, including the metallic alloys of silver and copper with organic binder which may form all or a part of this phase, is preferably between 2 and 90 percent, more preferably between 5 and 80 percent. The most preferable second phase content is between 10 and 75 percent when at least a part of the second phase is made up of superconductor powder precursors, including calcined, non-calcined and melt quenched powder precursors and between 2 and 20 percent when the second phase is made up of the metallic alloys or organic binders, e.g., epoxies, thermoplastic and thermosetting binders.

Appropriate binders which are non-aqueous, burn out at relatively low temperatures, and do not react or only react to a slight extent, either as such or as their decomposition products, with the ceramic body, may also be added to the second phase or to the composite mixture before final firing to increase the green density and strength of pressed articles and increase mobility for extrusion, tape casting, screen printing, or other conventional ceramic shaping and forming techniques. For extrusion, an appropriate binder/organic vehicle mixture which does not affect the final product and which burns out cleanly upon firing can be used. Examples of such binders include acrylic polymers, polybutenes, ethyl cellulose, and the like, and examples of such organic solvents include hydrocarbon solvents, alkanols, e.g., propanol, esters such as butyl carbinol acetate, and the like. The amount and type of binder are not critical, and can be optimized depending on the desired application and the forming technique employed.

A variety of formation techniques are suitable for producing shaped articles from the composite mixture. Preferred forming methods include extrusion, pressing, tape casting and screen printing.

Pressing has been found to be very effective in producing shaped articles with various geometries, including discs, rods, cylinders, and rings. Generally, binders are not required for press forming when a good particle size gradient exists in the powder mix, and if a binder of the type described is used and the shaped article is then fired, the binder will be consumed during firing Pressing can be performed in any conventional die. Hardened steel dies are excellent for this purpose.

The pressure used to form the shaped article can be extensively varied, as long as it does not affect the ability to remove the pressed article from the die or handle it during the preparations for the subsequent firing process. Larger pressures ensure a high packing and therefore usually allow a higher degree of densification. Pressures of from several thousand psi to more than a hundred thousand psi can be employed.

A binder, e.g., an organic binder of the type mentioned hereinabove, can be used when shaping an article from melt processed powders; and when a binder is used, it will not be necessary to fire the shaped article when the shaped article is fired, it can be placed on an appropriate refractory substrate or suspended using a refractory wire or string. Many conventional ceramic substrate materials are suitable when used for this purpose. A preferred ceramic substrate is an alumina substrate which is coated with a layer of a pre-fired mixture of Y—Ba—Cu oxide for the YBCO system, or of Bi—Sr—Ca—Cu oxide for the BSCCO system. These layers effectively prevent extensive reaction of the fired materials with the substrate at elevated temperatures.

Firing will take place in a gaseous environment which can be any of a variety of inert, oxidizing and reducing gases, depending on the temperature of the reaction and the desired reaction products For example, the peritectic reaction temperatures for YBCO systems depend on the oxygen partial pressure during the reaction. Thus, for YBCO systems, it is preferred that an oxygen environment be present during all of the heating and cooling steps. For BSCCO systems, air is the preferred atmosphere, however, both pure oxygen and air-oxygen mixtures may also be used. The gas pressure may vary, with a high gas pressure in the heat-treatment furnaces being desirable to keep the partially molten specimens from deforming, or to avoid the liquid phase draining out of the specimens.

The shaped objects can, if desired, be sintered before being fired, at higher temperatures to induce formation of the liquid phase. This step is believed to reduce cracking and homogenize the structure for the peritectic reaction.

The final properties of the superconductors fabricated by the present process are generally not sensitive to the heating rate before and after sintering temperature. Thus, the heating rate can be selected to be as high as desired, as long as the thermal shock resistance of the material is not exceeded. For example, heating rates of about 50° C./min have been used without causing any thermal shock degradation to the shaped articles.

The rate of heating to the maximum firing temperature is normally determined by the size of the specimen being heated, the type of furnace where heating takes place, and the gaseous environment. The heating rate can be from 50° C./min to 1° C./hr, preferably from 20° C./min to 1° C./min.

The maximum firing temperature is an important parameter in determining the final properties of the shaped articles in both systems. For the YBCO system, depending on the amount and the composition of the second phase, the final firing temperature can vary from above about 1000° C. to about 1300° C. If at least a part of the second phase consists of either calcined or non-calcined, or melt quenched powder precursors, the final firing temperature range is preferably between 1050° C. and 1300° C., most preferably between 1100° C. and 1250° C., depending on the amount of the second phase which is present. If at least a part of the second phase is an alloy of silver and copper, the final firing temperature is somewhat lower, preferably between about 1000° C. and about 1259° C., and most preferably between about 1050° C. and about 1200 °C. In the BSCCO system the final firing temperatures are generally lower than those of the YMCO system by approximately 100° C. to 200° C., as detailed in the following nonlimiting Examples. Preferably, the BSCCO system is fired at a temperature in the range from about 800° C. to 1150° C., more preferably from about 900° C. to about 1050° C.

The soak time at the peak firing temperature can be relatively broad. It can last from several minutes to several days, depending on the peak temperature and gas pressure and the specimen size.

Reaction kinetics are determined by time, the pressure of the gaseous environment in which firing takes place, and temperature. For practical and economic reasons, the preferred final firing temperature and time should be selected such that a shorter time is used at a temperature high enough that a fast reaction is promoted yet not so high as to cause excessive liquid drainage from the specimen. For example, for a typical YBCO article which has a diameter of 5 cm, and a thickness of 1.5 cm, peak firing is preferably at a temperature from about 1150° C. to about 1250° C. with a soak time of about 410 hours at the low end of the temperature range to about 10 minutes at the high end. A typical BSCCO article of similar size can be fired at a lower temperature, e.g., a peak firing temperature which can range from about 800° C. to about 1150° C., and preferably from about 900° C. to about 1050° C. Preferably the soak time is from about 10 minutes to about 3 hours, depending on temperature and on the size of the article.

The annealing schedule which is used to cool the article to lower temperatures can be greatly varied depending on the size of the article, the gas pressure, types and amounts of second phases present in the system. It is believed, without limiting the scope of this invention, that at the peak firing temperature the second phase melts and reacts with the major phase. By slow cooling from this high temperature, grain growth and grain rearrangement occurs.

In the YBCO system, at temperatures below about 1100° C., all or a majority of the 211 phase is converted to the 123 phase, with grain growth taking place simultaneously. If the grain growth is controlled under a temperature gradient, a continuous aligned structure similar to the melt texturing or zone refinement evolves, otherwise a dense multigrain structure with random grain orientation results.

Typically, nucleation takes place at or below the peak firing temperature. After nucleation has taken place, the temperature is lowered rapidly to a point where there is substantial grain growth. Slow cooling from the nucleation temperature to the grain growth temperature may, in some cases, cause agglomeration of the solid particles, which would degrade the homogeneity of the subsequent grain growth process. The rate of cooling from the nucleation temperature at or below the peak firing temperature to the grain growing temperature may be as high as 50° C./min. Cooling rates of from 2° C./min to 20° C./min are also acceptable, particularly since it may be impractical to force-cool in large heat treatment furnaces at a higher rate.

The optimum grain growth temperature for the YBCO system is from about 940° C. to about 1120° C., preferably from about 1000° C. to about 1100° C. For the BSCCO system, the grain growth temperature is in the range of from about 400° C. to about 1000° C., preferably in the range of from about 850° C. to about 950° C.

After rapidly cooling the article to the grain growth temperature, further cooling is slowly carried out to the temperature where no further appreciable grain growth is taking place (grain growth offset temperature). This cooling rate can be as slow as about 1° C./day. A preferred cooling rate is from about 0.5° C./hr to about 60° C./hr. A most preferred cooling rate is from about 1° C./hr to about 10° C./hr.

Grain texturing is most efficient when grain growth is taking place. Temperature gradients of 1° C. to 100° C./cm can be employed, depending on the size and geometry of the material being heat treated. For example, for disc shaped materials of 1-2 cm in thickness, a temperature gradient of 20° C. to 50° C./cm will produce good grain texturing. The temperature gradients can be in the X, Y and Z directions in rectilinearly-shaped bodies, while for those having cylindrical geometry the temperature gradients can be in the X-Y and radial directions.

In the YBCO system, the grain growth offset temperature is about 900° C. to about 980° C., preferably about 920° C. to about 960° C., depending on the exact composition. In the BSCCO systems, the grain growth offset temperature is generally from about 750° C. to about 900° C., with a more common range of from about 780° C. to about 850° C.

After reaching the grain growth offset temperature, the article is cooled to room temperature. This cooling is accompanied by a crystalline phase transformation. (e.g., tetragonal to orthorhombic for YBCO systems). Crystalline oxygenation can be done at somewhat higher cooling rates. The preferred final cooling rate is about 1° C./hr to about 60° C./hr, most preferably from about 2° C./hr to about 10° C./hr. An intermediate soak for articles formed from YBCO systems will usually be carried out at a temperature in the range of from about 700° C. to about 300° C., preferably from about 650° C. to about 400° C., for a time which may vary, depending on the size of the article and the gas pressure, from several hours to several weeks. For articles which are about 1 cm thick and have diameters of about 5 cm, the soak time will usually range from about 10 hours to about 100 hours. An intermediate soak time is usually not required for articles formed from bismuth-based systems, but when one is, similar soak times to those used for articles formed from YBCO systems will be used.

For YBCO systems, cooling (or annealing) is preferably performed under oxidizing conditions. The bismuth-based systems are preferably cooled under either air or oxidizing conditions. For YBCO, oxygen is the preferred oxidizing gas, and the cooling should take place at a pressure in the range from atmospheric pressure to about 20 atmospheres. For BSCCO, air or oxygen at comparable pressures may be used.

The grain aligned materials are suitable for carrying high current densities in applications such as those requiring the use of wires, while the multi-grained materials are suitable for levitation applications.

In order that those skilled in the art can more fully understand this invention, the following examples are set forth. These examples are given for purposes of illustration, and should not be considered as expressing limitations unless so set forth in the appended claims. All parts and percentages are by weight, unless otherwise stated.

EXAMPLE 1

This example illustrates the use of calcined YBCO powder precursor in the densification of melt processed YBCO.

The second phase YBCO precursor was prepared by mixing together ACS reagent grade $Y_2O_3$, $BaCO_3$, and CuO powders. The corresponding atomic ratio was 1:2:3 respectively for Y, Ba, and Cu. The powders were thoroughly mixed by ball milling in acetone using zirconia grinding media, and were then dried. Next, the mixture was calcined at atmospheric pressure under flowing oxygen at 930° C. for a period of 24 hours and slowly cooled. Upon removal from the furnace, the powders were ground with a mortar and pestle, refired under flowing oxygen at 950° C. for 20 hours, and slowly cooled. They were then ground to a fine particle size.

The melt processed powders of the first phase were prepared using the following procedure. A mixture with stoichiometric atomic ratio of 1.025 Y, 2.0 Ba, and 3.0 Cu was prepare using ACS reagent grade $Y_2O_3$, $BaCO_3$, and CuO powders. The powders were mixed and calcined as described above for the second phase. The calcined powders were charged into a platinum crucible which was heated to about 1450° C., and kept at that temperature for about 20 minutes, causing the majority of the material to melt. The molten material was quenched by pouring it into a brass mold, and was rapidly reheated to 1200° C. for about 35 minutes.

Annealing was initiated by first cooling to 1050° C. at a rate of about 17° C./min, followed by cooling to 1030° C. at a rate of 2° C./hr, and then to 980° C. at a rate of about 1° C./min. Cooling from 980° C. to room temperature was carried out at an average rate of 1° C./min. The oxygen partial pressure during the annealing process was kept at 25 psi, while the gas was allowed to flow out at a small rate of about 10-20 ml/min.

The annealed material was removed from the furnace, ground with a mortar and pestle, and was sieved through a 20-mesh screen. No attempts were made to separate the fines. The first phase powders were then mixed with 15 wt % of the second phase powders, and they were mixed together under dry conditions by ball milling in a plastic jar for about 20 minutes. The mixture was pressed into a cylindrical shape at a pressure of about 15,000 psi. The resulting cylinder was heated to 980° C. at a rate of about 5° C./min, soaked for 20 hours at 980° C., and then subsequently heated at a rate of 20° C./min to 1220° C. The cylinder was left at this temperature for about 20 minutes. Annealing was initiated by first cooling rapidly at a rate of about 17° C./min to 1075° C., then at 2° C./hr to 1050° C., at 1° C./hr to 985° C., at 20° C./hr to 620° C., at 6° C./hr to 300° C., and finally at an average rate of 40° C./hr to room temperature. The oxygen pressure during the annealing process was maintained at about 25 psi, while the gas was flowing out from the furnace at a low rate of about 10-20 ml/min.

The final product had a density of about 5.84 g/cc without any apparent macro-porosity. No apparent deformation was observed after firing, even though the body had shrunk in volume. Magnetization measurements were carried out using a PARC vibrating sample magnetometer. The results obtained showed consistent and uniform magnetization values for the various portions of the material, both at low and high applied fields for different portions of the material. The value of the maximum magnetization at low field, $M_{max}$ was 9.42 emu/g at about 163 Oe, and the value of delta M, the difference in magnetization between increasing and decreasing in magnetization between increasing and decreasing fields at an applied magnetic field of 2KOe, was 11.02 emu/g respectively.

EXAMPLE 2

This example illustrates another embodiment in which the first phase consists of melted and quenched material which is not reheated or annealed prior to mixing with the minor phase.

The second or minor phase was prepared using the procedure described in Example 1.

The first phase preparation procedure was identical to that given in Example 1, but there was no reheating and annealing after quenching. The proportions of the two phases was the same as in Example 1, and the mixture was mixed, pressed, heat-treated and annealed as set forth in Example 1. The final product density was 5.7 g/cc. The maximum magnetization was 1.0 emu/g at 141 Oe, and delta M was 0.141 emu/g at 2 kOe.

EXAMPLE 3

This example illustrates a YBCO embodiment in which the second phase is not calcined.

The second phase was prepared under conditions identical to those given in Example 1, but was not calcined. The first phase was the same as the one described in Example 1. The mixture was processed as disclosed in Example 1, except that the peak heat-treatment temperature in the final firing step was set at 1180° C. instead of 1200° C. The final product density was about 5.3 g/cc. The maximum magnetization was 3.28 emu/g at 171 Oe and delta M was 2.27 emu/g at 2 kOe. In a similar embodiment where the peak heat treatment temperature was increased to about 1200° C., the resulting product had a density of about 5.75 g/cc, a maximum magnetization of 5.08 emu/g at 130 Oe, and a delta M of 6.57 emu/g at 2 kOe.

EXAMPLE 4

This example illustrates a YBCO embodiment in which the second phase in a mixture of 123 and 211 phases and both are calcined. The first phase consists of melted and quenched YBCO material.

The first phase preparation procedure was similar to that given in Example 2. 211 precursor was prepared by mixing together ACS reagent grate $Y_2O_3$, $BaCO_3$ and CuO powders. The corresponding atomic ratio was 2:1:1 respectively for Y, Ba, and Cu. The calcination steps were similar to the preparation of calcined 123 given in Example 1, with about 20° C. higher calcination temperature. Seven parts of the first phase by weight was mixed with $B_2$ parts of 123 phase and 1 part of the 211 phase. Sample preparation and firing were identical to those for the sample of Example 1. A sample approximately 5 cm in diameter and 1.2 cm in thickness had a levitation pressure of more than 8 psi, and a damping ratio of about 90. The maximum magnetization was about 11.0 emu/g at 150Oe.

EXAMPLE 5

This example illustrates a YBCO embodiment in which the second phase is a mixture of copper and silver metals.

A mixture of fine powders of silver and copper (reagent grade) was prepared in which the wt % of silver was about 70%. The first phase material was the same as that prepared in Example 1. Ten percent by weight of the metal mixture was mixed with the major phase material in a mortar and pestle. This mixture was pressed into a pellet at about 20 kpsi. The pellet was heated at a rate of about 5° C./min to 980° C., and left at 980° C. for about 20 hours. After cooling to room temperature, the pellet was re-heated to 1100° C., under flowing $O_2$ and left at 1100° C. for about 60 minutes. The annealing schedule was as follows: the pellet was first cooled to 1075° C., at a rate of 5° C./min, to 975° C. at a rate of 2° C./hr, to 650° C. at a rate of 30° C./hr, and finally to room temperature at a rate of about 10° C./hr, all under flowing $O_2$ at atmospheric pressure. The final product had a density of 6.05 g/cc, a maximum magnetization of 1.31 emu/g at 123 Oe, and a delta M of 0.5 emu/g at 2 kOe.

EXAMPLE 6

This example illustrates an embodiment using bismuth-based materials.

A stoichiometric mixture of Bi:Ca:2Sr:3Cu oxides were prepared using bismuth nitrate penta hydrate, calcium oxide, strontium carbonate, and copper oxide, all reagent grade chemicals. Mixing was carried out by ball milling the chemicals in acetone for 2 hours. After drying, the powders were calcined at about 800° C. for about 18 hours, cooled slowly to room temperature, ground, recalcined at about 820° C. for about 18 hours, and cooled slowly to room temperature. All of the above thermal processes were carried out under flowing oxygen.

The calcined material was melted in a platinum crucible at about 1150° C. for about 30 minutes, quenched by pouring into a brass mold, and cooled to room temperature. The resulting material was placed on an alumina substrate which was coated with the above bismuth-based calcined powders, heated to 850° C. at a rate of about 5° C./min, left at 850° C. for about 16.7 hours, cooled to 820° C., and left at 820° C. for about 13.3 hours. The material was annealed at a rate of 10° C./hr to room temperature, after which it was ground in a mortar and pestle to a particle size less than 40 mesh.

The first phase was mixed with a second phase made up of the above calcined powders which had not been melt quenched. The first phase was present in about 85% (by weight) of the material with 15% being made up of the calcined material (before melting) as the second phase. The resulting mixture was pressed into a pellet at about 20 kpsi. The pellet was, about 2 cm in diameter and 2 cm thick. The pellet was heated to about 850° C. at a rate of about 5° C./min, and annealed according to the schedule used to anneal the melt quenched material.

The resulting product had a uniform structure with a density of about 4.4 g/cc and a superconducting onset temperature of about 116 K, as measured by dc susceptibility.

EXAMPLE 7

This example illustrates another bismuth based embodiment with a second phase made of silver and copper metals.

The first phase was prepared under the conditions described in Example 6. The first phase was then mixed with 10 wt % of the mixture of silver and copper powders used in Example 5. The mixture was pressed, heated, and annealed under the heating and cooling cycles, described in Example 6.

The resulting material had a uniform structure with a density of about 4.8 g/cc, and an onset superconducting transition temperature of about 116K, as measured by dc susceptibility.

EXAMPLE 8

This example illustrates the use of melt quenched powders which do not contain platinum as the second phase.

A second phase YBCO melt quenched powder was prepared by mixing together reagent grade $Y_2O_3$, $BaCO_3$, and CuO in corresponding atomic ratio of 1.4:2:3 (Y:Ba:Cu) as described in example one and calcining the resulting mixture at about 910° C. for about 44 hours under flowing oxygen. The product was cooled in furnace, ground and calcined again to about 920° C. in oxygen for about 24 hours. The product was cooled in the furnace, reground and packed inside a 1" inside diameter alumina tube approximately 5" long. The tube was heated to 998° C. for about 48 hours under flowing oxygen which resulted in a sintered rod-like preform. The preform was melted from one of its ends by bringing it into the flame of a hydrogen torch and moving the preform downward slowly which resulted in a continuous melt down of the preform from one end. The resulting molten droplets fell over and collected on a brass plate kept at room temperature which resulted in a rapid quench. The product was ground and sieved to less than 200 mesh particle size. The first phase material was prepared according to similar procedures given in Example 1. 60 parts of the first phase by weight was mixed with 40 parts of the second phase by dry ball milling of the two in a Teflon jar mill using high density zirconia balls for about 3 hours. The powder mixture was pressed into a cylinder at a pressure of about 15,000 psi and sintered at 950° C. for about 20 hours oxygen. The sample was then heated to about 1200° C. and kept there for about 2 hours. In annealing steps, the specimen was cooled first to about 1160° C. at a rate of 330° C./hr, to about 850° C. at an average rate of about 3° C./hr and a temperature gradient of about 10° C./cm, and then to room temperature at an average rate of 15° C./hr with an intermediate soak of 20 hours at 550° C. The oxygen pressure in the firing furnace was from 20 to 25 psi during firing and annealing process. The sample was fully dense with almost no visible high angle grain boundaries. The value of maximum magnetization of a 67 mg section of the same was 3.45 emu/g at 202 Oe and delta M at 2 KOe was 2.28 emu/g.

EXAMPLE 9

This example illustrates the use of an organic binder as the second phase.

The first phase material was made from reagent grades of $Y_2O_3$, $Pr_2O_3$, $BaCO_3$, and CuO with atomic ratio of (1:0.01:2:3) as (Y:Pr:Ba:Cu). Calcination and melting were carried out similarly to the procedures given for the first phase in Example 1. The melt-quenching material was annealed by heating it rapidly at a rate of about 100° C./hr to 1200° C., soaking it at this temperature for about 35 minutes, cooling to 1040° C. at a rate of 100° C./hr, 1° C./hr to 970° C., and to room temperature at an average rate of 18° C./hr. The resulting superconductor was ground and sieved through 200 mesh screen. Rubber cement was then mixed with the first phase at a mass ratio of about 1:22 (rubber cement: first phase powder). Mixing was carried out in an aluminum dish using a spatula. The resulting mixture was pressed into the shape of a disc at about 45,000 psi. The resulting disc had very good mechanical strength and strong levitation. The specimen had very good thermal shock resistance as was evident from cooling it to liquid nitrogen immediately after being pressed and from reheating it to room temperature, since during these cooling and heating procedures the specimen did not show any sign of cracking or mechanical degradation.

The above discussion of this invention is directed primarily to preferred embodiments and practices thereof. It will be readily apparent to those skilled in the art that further changes and modifications in the actual implementation of the concepts described herein can easily be made without departing from the spirit and scope of the invention as defined by the following claims.

What is claimed is:

1. A method of producing a superconducting article comprising:
   (a) mixing superconducting oxide precursors to form a first phase;
   (b) heating the first phase to a temperature at which the first phase melts;
   (c) quenching the molten first phase by rapid cooling;
   (d) grinding the first phase to form a powder;
   (e) mixing the ground first phase with a second phase comprising (i) superconducting oxide precursors, or (ii) a mixture of metallic silver and metallic copper, or (iii) mixtures of (i) and (ii);
   (f) forming the mixture of the first phase and the second phase into a shaped article;
   (g) heating the shaped article to an elevated firing temperature;
   (h) rapidly cooling the article from the elevated firing temperature to a grain growth temperature;
   (i) slowly cooling the article from the grain growth temperature to a grain offset temperature; and
   (h) cooling the article to room temperature.

2. A method according to claim 1, wherein the first phase is calcined at least once prior to melting.

3. A method according to claim 1, wherein the melted and quenched first phase is subjected to the following steps, prior to grinding:
   (i) re-heating the melt-quenched first phase to an elevated temperature;
   (ii) rapidly cooling the reheated melt quenched first phase to a grain growth temperature;
   (iii) slowly cooling the melt quenched first phase from the grain growth temperature to a grain offset temperature; and
   (iv) cooling to room temperature.

4. A method of producing a Y-BaCu-O superconducting article comprising:
   (a) forming a first phase by mixing yttrium, barium and copper containing superconducting oxide precursors;
   (b) melting the first phase at a temperature above about 1200° C.;
   (c) quenching the molten first phase by rapid cooling;
   (d) grinding the first phase to form a powder;
   (e) mixing the ground first phase with a second phase comprising one or more compositions selected from the group consisting of a mixture of yttrium, barium and copper containing at least a portion of (i) superconducting oxide precursors, (ii) a mixture of bismuth, strontium, calcium and copper containing at least a portion of superconducting oxide precursors, or (iii) a mixture of metallic silver and metallic copper;
   (f) forming the mixture of the first phase and the second phase into a shaped article;
   (g) heating the shaped article to a maximum firing temperature in the range from 1000° C. to 1300° C., under an oxygen containing atmosphere;
   (h) soaking the article at the maximum firing temperature for several minutes to several days;
   (i) rapidly cooling the soaked shaped article to a grain growth temperature in the range from 1000° C. to 1180° C., under an oxygen atmosphere;
   (j) slowly cooling the shaped article from the grain growth temperature to a grain offset temperature in the range from 900° C. to 980° C., under an oxygen atmosphere; and
   (k) cooling the shaped article from the grain offset temperature to room temperature.

5. A method according to claim 4, wherein the first phase is melted at a temperature above 1300° C.

6. A method according to claim 5, wherein the first phase is melted at a temperature in the range from 1400° C. to 1500° C.

7. A method according to claim 6, wherein the first phase is melted in a Group VIII A metal-containing crucible.

8. A method according to claim 6, wherein the first phase contains a platinum group metal and is melted by RF heating, plasma heating, laser heating or a hydrogen flame.

9. A method according to claim 8, wherein the platinum group metal is platinum and its concentration in the first phase is from about 0.01 to about 5 weight percent, based on the total weight of the final product.

10. A method according to claim 4, wherein the second phase comprises a mixture of yttrium, barium and copper containing superconducting oxide precursors.

11. A method according to claim 4, wherein the second phase contains at least one nonsuperconducting additive or additives to improve at least one of densification, the article's mechanical properties, and flux pinning.

12. A method according to claim 11, wherein the nonsuperconducting additive is one or more of Y:Ba:Cu 2:1:1-containing phases, platinumcontaining phases and an organic binder.

13. A method according to claim 10, wherein the shaped article is heated to a temperature in the range from 1050° C. to 1300° C.

14. A method according to claim 4, wherein the second phase comprises at least a portion of a mixture of metallic silver and metallic copper.

15. A method according to claim 14, wherein the maximum firing temperature is in the range from 1000° C. to 1250° C.

16. A method according to claim 15, wherein the maximum firing temperature is in the range from 1050° to 1200° C.

17. A method according to claim 4, wherein the grain growth temperature is in the range from 940° C. to 1180° C.

18. A method according to claim 4, wherein the grain offset temperature is in the range from 900° C. to 960° C.

19. A method according to claim 4, wherein the ratio of Y:Ba:Cu in the first phase is from 1:2:4 to 2:2:3.

20. A method of producing a Bi-SrCa-Cu-O superconducting article comprising:
   (a) forming a first phase by mixing bismuth, strontium, calcium, and copper containing superconducting oxide precursors;
   (b) melting the first phase at a temperature in the range from 1100° C. to 1350° C.;
   (c) quenching the molten first phase by rapid cooling;
   (d) grinding the quenched first phase to form a powder;
   (e) mixing the powdered first phase with a second phase comprising one or more of a mixture of yttrium, barium and copper containing superconducting oxide precursors; a mixture of bismuth, strontium, calcium, and copper containing superconducting oxide precursors; and a mixture of metallic silver and metallic copper;

(f) forming the mixture of the first phase and the second phase into a shaped article;

(g) heating the shaped article under an oxygen containing atmosphere to a maximum firing temperature in the range from 800° C. to 1150° C.;

(h) soaking the heated shaped article at the maximum firing temperature from several minutes to several days;

(i) rapidly cooling the soaked shaped article from the maximum firing temperature to grain growth temperature in the range from 800° C. to 1000° C., under an oxygen containing atmosphere;

(j) slowly cooling the shaped article, under an oxygen containing atmosphere, from the grain growth temperature to a grain offset temperature in the range from 750° C. to 900° C.;

(k) cooling the shaped article, under an oxygen containing atmosphere, to room temperature.

21. A method according to claim 20, wherein the first phase is melted at a temperature in the range from 1150° C. to 1250° C.

22. A method according to claim 20, wherein the maximum firing temperature is in the range from 900° C. to 1050° C.

23. A method according to claim 20, wherein the grain offset temperature is in the range from 780° C. to 850° C.

24. A method according to claim 20, wherein the second phase is selected from mixtures of metallic silver and metallic copper.

25. A method according to claim 20, wherein the second phase is selected from a mixture of bismuth, strontium, calcium, and copper containing superconducting oxide precursors.

26. A method according to either claim 4 or claim 19, wherein the cooling from the maximum firing temperature to the grain growth temperature takes place at a rate up to 50° C./min.

27. A method according to claim 26, wherein the rate of cooling is in the range from 2° C./min to 20° C./min.

28. A method according to either claim 4 or claim 16, wherein the cooling from the grain growth temperature to the grain offset temperature takes place at a rate as slow as 1° C./day.

29. A method according to claim 28, wherein the cooling takes place at a rate from 0.5° C./hr to 60° C./hr.

30. A method according to claim 29, wherein the cooling takes place at a rate from 1° C./hr to 10° C./hr.

31. A method according to either claim 4 or claim 17, wherein the major phase is calcined one or more times prior to melting.

32. A method according to either claim 14 or claim 24, wherein silver is present in an amount of from 1% to 99% by weight of the second phase and copper is present in an amount from 99% to 1% by weight of the second phase, the sum of the silver and copper weight percentages being 100% of the second phase.

33. A method according to claim 27, wherein the silver is present in an amount of 70% by weight of the second phase.

34. A method according to either claim 4 or claim 20 wherein the second phase is present in an amount of from 2% to 90% by weight relative to the combined weight of the first and second phases.

35. A method according to claim 34, wherein the second phase is present in an amount of from 5% to 80% by weight.

36. A method according to claim 34, wherein the second phase is a mixture of yttrium, barium and copper containing superconducting oxide precursors or a mixture of bismuth, strontium, calcium and copper containing superconducting oxide precursors, the second phase being present in an amount between 10% and 75% by weight relative to the combined weight of the first and second phase.

37. A method according to either claim 14 or claim 24, wherein the second phase is present in an amount of from 5% to 25% by weight relative to the combined weight of the first and second phases.

38. A method according to either claim 4 or claim 20, wherein the melted and quenched first phase is subjected to the following treatment prior to grinding:

(i) re-heating the melt quenched first phase to an elevated temperature and soaking it;

(ii) slowly cooling the first phase from the grain growth temperature to a grain offset temperature; and (iv) cooling the first phase from the grain offset temperature to room temperature.

39. A method according to either claim 4 or claim 20, wherein the shaped article is formed by pressing, extrusion, tape casting or screen printing.

40. A method according to either claim 4 or claim 20, wherein an organic binder is added to the mixture.

41. A method according to either claim 4 or claim 20, wherein the second phase comprises a binder material.

42. A method according to claim 41, wherein the binder material comprises an organic phase.

43. A method according to claim 41, wherein the binder material comprises a metallic phase.

* * * * *